United States Patent
Yang et al.

(10) Patent No.: US 9,293,336 B2
(45) Date of Patent: Mar. 22, 2016

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Sangryol Yang, Suwon-si (KR);
Soonwook Jung, Hwaseong-si (KR);
Kyoungseob Kim, Suwon-si (KR);
Youngsub You, Osan-si (KR);
Byunghong Chung, Seoul (KR);
Hanmei Choi, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/258,107

(22) Filed: Apr. 22, 2014

(65) Prior Publication Data

US 2014/0319690 A1 Oct. 30, 2014

(30) Foreign Application Priority Data

Apr. 24, 2013 (KR) ........................ 10-2013-0045183

(51) Int. Cl.
*H01L 29/40* (2006.01)
*H01L 21/283* (2006.01)
*H01L 21/768* (2006.01)

(52) U.S. Cl.
CPC ............ *H01L 21/283* (2013.01); *H01L 29/401* (2013.01); *H01L 21/76805* (2013.01)

(58) Field of Classification Search
CPC ............ H01L 21/283; H01L 21/76889; H01L 21/76895; H01L 29/40
USPC ........................................... 257/773; 438/666
See application file for complete search history.

(56) References Cited

U.S. PATENT DOCUMENTS

| | | | |
|---|---|---|---|
| 6,500,763 B2 | 12/2002 | Kim et al. | |
| 6,537,875 B2 | 3/2003 | Won et al. | |
| 6,642,101 B2 | 11/2003 | Ohno | |
| 6,656,790 B2 | 12/2003 | Jang et al. | |
| 7,361,547 B2 | 4/2008 | Lee et al. | |
| 2004/0219744 A1* | 11/2004 | Oh et al. | 438/238 |
| 2005/0272250 A1 | 12/2005 | Yun et al. | |
| 2006/0030116 A1* | 2/2006 | Moon et al. | 438/386 |
| 2006/0060907 A1 | 3/2006 | Kim et al. | |
| 2006/0138511 A1 | 6/2006 | Chung et al. | |
| 2006/0141702 A1* | 6/2006 | Woo et al. | 438/250 |
| 2008/0186648 A1* | 8/2008 | Choi et al. | 361/305 |
| 2010/0052098 A1* | 3/2010 | Miyajima | 257/532 |
| 2011/0115051 A1* | 5/2011 | Kim et al. | 257/532 |
| 2012/0125879 A1* | 5/2012 | Park et al. | 216/6 |
| 2012/0132968 A1* | 5/2012 | Choi | 257/296 |

* cited by examiner

*Primary Examiner* — Christine Enad
(74) *Attorney, Agent, or Firm* — Lee & Morse, P.C.

(57) ABSTRACT

A semiconductor device includes a storage node contact on a substrate, and a lower electrode on the storage node contact, a lower sidewall of the lower electrode being covered by a contact residue of a same material as the storage node contact.

18 Claims, 24 Drawing Sheets

SEMICONDUCTOR DEVICE AND METHOD OF FABRICATING THE SAME

CROSS-REFERENCE TO RELATED APPLICATION

Korean Patent Application No. 10-2013-0045183, filed on Apr. 24, 2013, in the Korean Intellectual Property Office, and entitled: "Semiconductor Device and Method Of Fabricating The Same," is incorporated by reference herein in its entirety.

BACKGROUND

1. Field

Embodiments relate to semiconductor devices and methods of fabricating the same.

2. Description of the Related Art

Semiconductor devices are widely used in an electronic industry because of their small size, multi-function, and/or low fabrication cost. Semiconductor devices have been increasingly integrated with the development of the electronic industry. For example, widths and spaces of patterns of semiconductor devices are being reduced in order to provide high integration of semiconductor devices. However, as new exposure techniques and/or highly expensive exposure techniques are required to form fine patterns of semiconductor devices, it may be difficult to form highly integrated semiconductor devices.

SUMMARY

In one aspect, a semiconductor device may include a storage node contact on a substrate, and a lower electrode on the storage node contact. A lower sidewall of the lower electrode may be covered by a contact residue of the same material as the storage node contact.

In some embodiments, the semiconductor device may further include a first protection layer surrounding a lower portion of the lower electrode. A top surface of the first protection layer may be higher than a top end of the contact residue.

In some embodiments, the semiconductor device may further include an ohmic layer between the lower electrode and the storage node contact. The top surface of the first protection layer may be higher than a top end of the ohmic layer.

In some embodiments, the storage node contact may include a plurality of storage node contacts, each of the storage node contacts may include a first contact pattern and a second contact pattern that are sequentially stacked, and the lower electrode may include a plurality of lower electrodes respectively disposed on the plurality of storage node contacts. In this case, the semiconductor device may further include: a filling insulating layer disposed between the first contact patterns adjacent to each other and covered by the first protection layer, and an etch stop layer disposed between the first protection layer and the filling insulating layer.

In some embodiments, the semiconductor device may further include: at least one supping layer contacting an upper sidewall of the lower electrode.

In some embodiments, the supporting layer may include a metal oxide layer. In this case, the semiconductor device may further include: a second protection layer contacting at least one of a top surface and a bottom surface of the supporting layer.

In some embodiments, a top surface of the storage node contact may be concave.

In some embodiments, the supporting layer and the first protection layer may be formed of insulating layers, respectively.

In some embodiments, the semiconductor device may further include: a dielectric layer covering a sidewall and a top surface of the lower electrode, and an upper electrode covering the dielectric layer. The dielectric layer may extend to cover a sidewall of the contact residue.

In another aspect, a method of fabricating a semiconductor device may include forming a storage node contact on a substrate, sequentially forming a first protection layer and a mold layer that cover the storage node contact, successively patterning the mold layer and the first protection layer to form a contact hole exposing the storage node contact, and forming a lower electrode filling the contact hole. An upper portion of the storage node contact may be dug and a contact residue may be formed on a lower sidewall of the contact hole when the contact hole is formed. A height of a top surface of the first protection layer may be higher than a top end of the contact residue.

In some embodiments, the mold layer may be formed of poly-silicon or single-crystalline silicon, and the storage node contact may include a metal layer.

In some embodiments, the first protection layer may be formed of at least one of a silicon oxide layer, a silicon nitride layer, a silicon oxynitride layer, a silicon-carbon nitride layer, or a silicon-carbon oxynitride layer.

In some embodiments, the method may further include: forming a supporting layer on the mold layer. In this case, the contact hole may be formed by successively patterning the supporting layer, the mold layer, and the first protection layer.

In some embodiments, the supporting layer may be formed of a metal oxide layer, and the method may further include: forming a second protection layer between the supporting layer and the mold layer.

In yet another aspect, a semiconductor device may include a storage node contact on a substrate, a lower electrode on the storage node contact, and a contact residue of a same material as the storage node contact and extending from the storage node contact along a lower sidewall of the lower electrode, an outermost surface of the contact residue and an outermost surface of an upper sidewall of the lower electrode being level with each other.

In some embodiments, the semiconductor device may further include a first protection layer overlapping the contact residue, the first protection layer being in direct contact with the contact residue and in direct contact with a portion of the lower electrode.

In some embodiments, the semiconductor device may further include a dielectric layer on a sidewall of the lower electrode, the first protection layer separating the dielectric layer from the contact residue, and an upper electrode on the dielectric layer, the dielectric layer separating the first protection layer from the upper electrode and from the lower electrode.

In some embodiments, the contact residue may be integral with the storage node contact and defines an empty, volumetric space above the storage node contact, a lower end of the lower electrode being insertable into the volumetric space.

In some embodiments, the level outermost surfaces of the contact residue and lower electrode may define openings between adjacent lower electrodes, respective dielectric layers and upper electrodes being positioned in the defined openings.

In some embodiments, the semiconductor may further include a dielectric layer on a sidewall of the lower electrode, the dielectric layer being in direct contact with the contact residue and in direct contact with a portion of the lower electrode, and an upper electrode on the dielectric layer.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
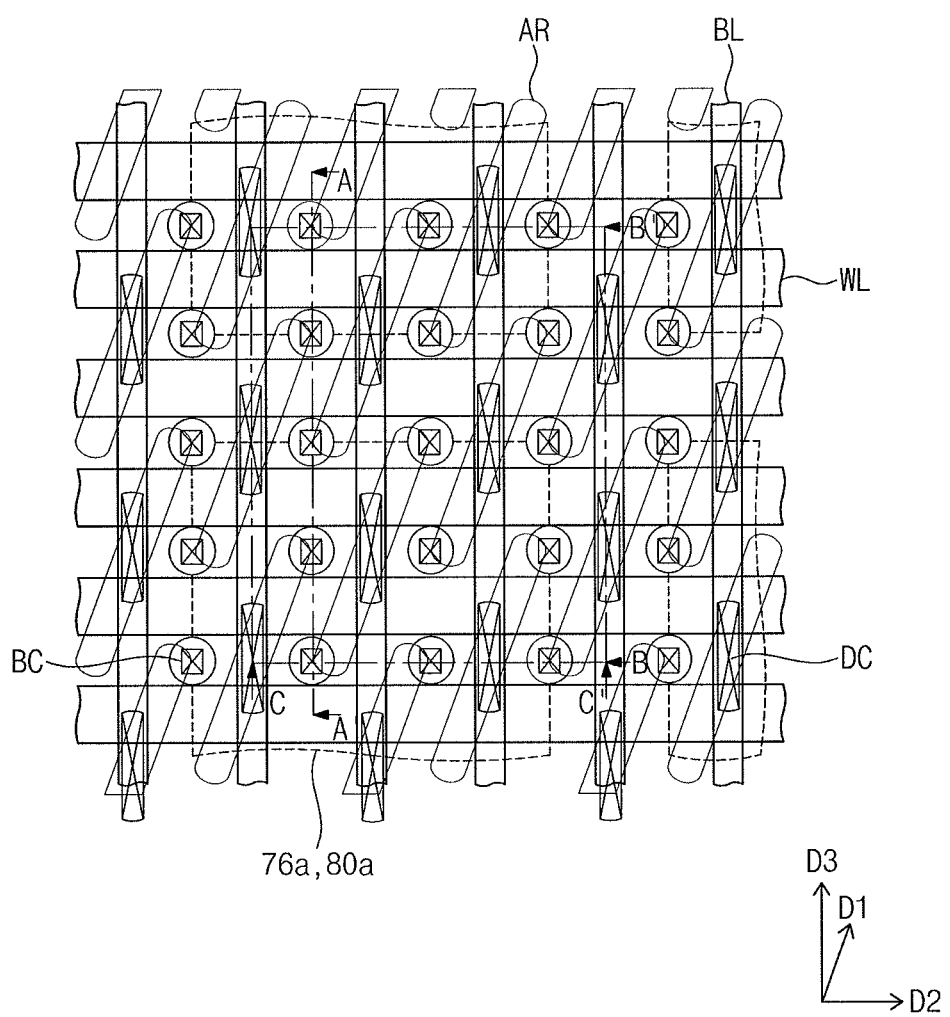
FIG. 1 illustrates a plan view of a semiconductor device according to example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

The terminology used herein is for the purpose of describing particular embodiments only and is not intended to limit. As used herein, the singular terms "a," "an" and "the" are intended to include the plural forms as well, unless the context clearly indicates otherwise. As used herein, the term "and/or" includes any and all combinations of one or more of the associated listed items.

It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements.

It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In the drawing figures, the dimensions of layers and regions may be exaggerated for clarity of illustration. Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements. Thus, this should not be construed as limiting embodiments.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the embodiments. Exemplary embodiments explained and illustrated herein include their complementary counterparts. The same reference numerals or the same reference designators denote the same elements throughout the specification.

First Embodiment

Figure 2:
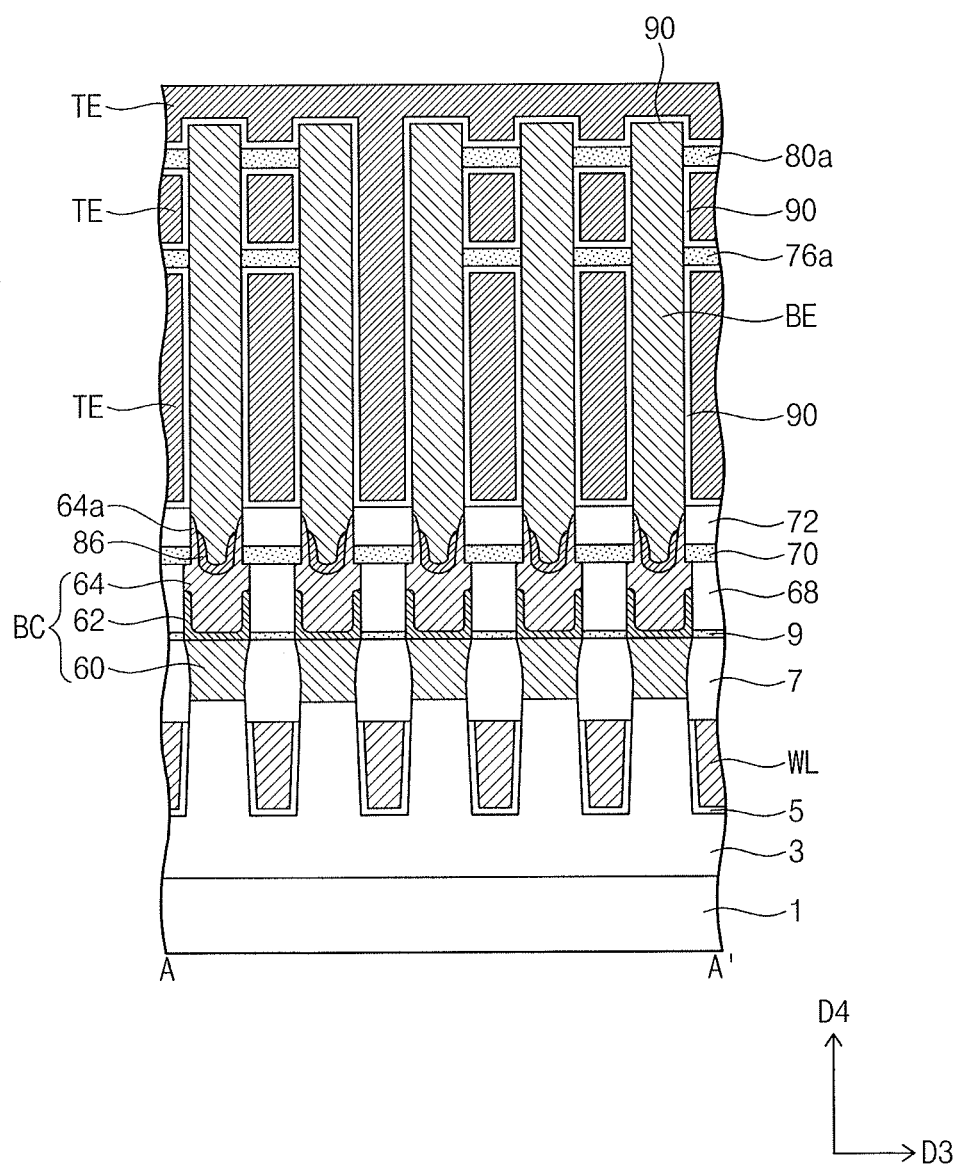
FIG. 2 illustrates a cross-sectional view taken along a line A-A' of FIG. 1 according to a first embodiment.
Figure 3:
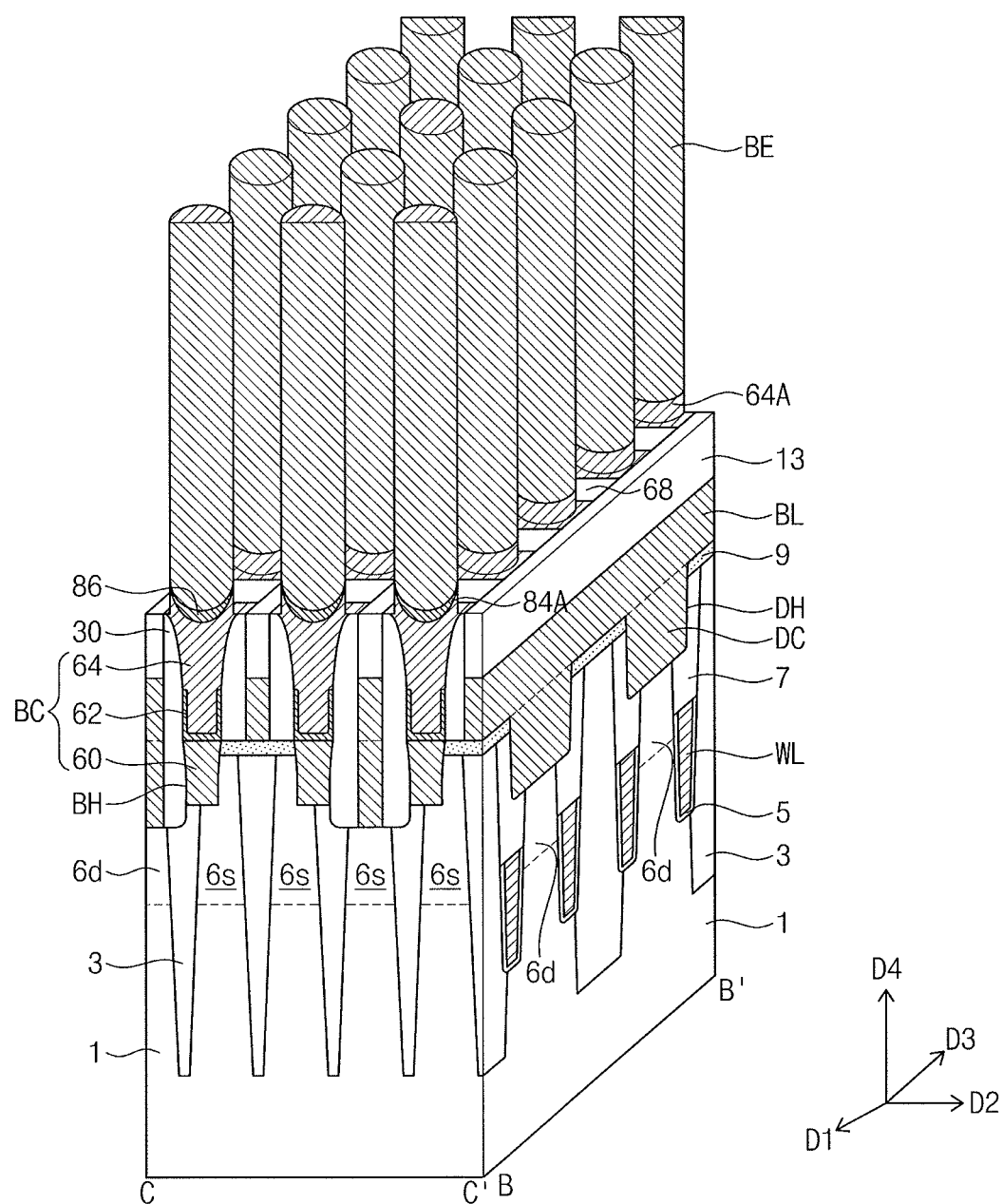
FIG. 3 illustrates a perspective view having cross-sectional views taken along lines B-B' and C-C' of FIG. 1.

FIG. 1 illustrates a plan view of a semiconductor device according to example embodiments. FIG. 2 illustrates a cross-sectional view taken along a line A-A' of FIG. 1 according to a first embodiment. FIG. 3 illustrates a perspective view having cross-sectional views taken along lines B-B' and C-C' of FIG. 1.

Referring to FIGS. 1 to 3, a device isolation layer 3 defining an active region AR may be disposed on or in a substrate 1. The active region AR may have a bar-shape extending in a first direction D1 when viewed from a plan view. The active region AR may be provided in plural. The active regions AR may be parallel to each other.

A plurality of word lines WL may be disposed in the substrate 1 to cross the active region AR and the device isolation layer 3. The word lines WL may extend in a second direction D2. The word lines WL may include at least one of poly-silicon, a metal silicide, and a metal. The second direction D2 crosses the first direction D1. The word lines WL are disposed in recessed regions, respectively. Top surfaces of the word lines WL may be disposed to be lower than a top surface of the substrate 1.

A gate insulating layer 5 may be disposed between the substrate 1 and each word line WL. A first dopant injection region 6s may be disposed in the active region AR at a side of each word line WL, and a second dopant injection region 6d may be disposed in the active region AR at another side of each word line WL. The second dopant injection region 6d may be disposed between two word lines WL adjacent to each other in each active region AR. First capping patterns 7 may be disposed on the word lines WL, respectively. A top surface of the first capping pattern 7 may be disposed at the same height as the top surface of the substrate 1.

In the present embodiment, the word lines WL are disposed in the substrate 1. Thus, a cell transistor has a recessed channel region. As a result, a short channel effect characteristic of the cell transistor may be improved to minimize or substantially prevent a leakage current of a highly integrated semiconductor device.

A first insulating layer 9 may be disposed on the substrate 1. The first insulating layer 9 may be formed of at least one of a silicon oxide layer, a silicon nitride layer, and a silicon oxynitride layer. Bit lines BL are disposed on the first insulating layer 9. The bit lines BL may extend in a third direction D3 crossing the first and second directions D1 and D2. The bit lines BL may include a metal-based material. Second capping patterns 13 may be disposed on the bit lines BL, respectively. The second capping pattern 13 may be formed of the same material as the first capping pattern 7. The bit lines BL are electrically connected to the second dopant injection regions 6d through bit line node contacts DC penetrating the first insulating layer 9.

The bit line node contacts DC may include at least one of a metal silicide layer, a poly-silicon layer, a metal nitride layer, and a metal layer. The bit lines BL have the same width as the bit line node contacts DC. Sidewalls of the bit lines BL are aligned with sidewalls of the bit line node contacts DC. The bit line node contacts DC are disposed in bit line node contact holes DH, respectively. Bottom surfaces of the bit line node contact holes DH (or the bit line node contacts DC) may be lower than the top surface of the substrate 1. A width parallel to the second direction D2 of the bit line node contact hole DH may be wider than a width parallel to the second direction D2 of the bit line node contact DC.

Storage node contacts BC may be disposed between the bit lines BL. The storage node contacts BC are in contact with the first dopant injection regions 6s, respectively. Bottom surfaces of the storage node contacts BC are lower than the top surface of the substrate 1. Each of the storage node contacts BC may include a first contact pattern 60 and a second contact pattern 64. The first contact pattern 60 may be formed of poly-silicon. The second contact pattern 64 may be formed of, for example, a metal, e.g., tungsten. A diffusion barrier layer 62 may be disposed between the first contact pattern 60 and the second contact pattern 64. The diffusion barrier layer 62 may be formed of, e.g., a titanium nitride layer. A top surface of the second contact pattern 64 may be concave.

A spacer 30 may be disposed between the bit lines BL and the storage node contacts BC, and between the bit line node contacts DC and the storage node contacts BC.

A second insulating layer 68 may be disposed between the bit lines BL and between the storage node contacts BC. Data storage elements may be disposed on the storage node contacts BC. In the present embodiment, the data storage element may be a capacitor including a lower electrode BE, a dielectric layer 90, and an upper electrode TE, and the semiconductor device may be a dynamic random access memory (DRAM) device. The lower electrode BE may have a plug-shape or a pillar-shape.

A lower sidewall of the lower electrode BE may be covered by a contact residue 64a including the same material as the second contact pattern 64. For example, if the second contact pattern 64 is formed of tungsten, the contact residue 64a is formed of tungsten. An ohmic layer 86 may be disposed between the lower electrode BE and the second contact pattern 64. In the present embodiment, the lower electrode BE and the upper electrode TE may be formed of, e.g., titanium nitride. The dielectric layer 90 may be formed of, e.g., a silicon oxide layer and/or a high-k dielectric layer. At this time, the ohmic layer 86 may be formed of, e.g., a titanium layer.

An etch stop layer 70 is disposed on the second insulating layer 68 and the second capping pattern 13. The etch stop layer 70 may be in contact with a sidewall of the contact residue 64a. A protection layer 72 is disposed on the etch stop layer 70. For example, the protection layer 72 may be formed of at least one of a silicon oxide layer, a silicon nitride layer, a silicon oxynitride layer, a silicon-carbon nitride layer, or a silicon-carbon oxynitride layer. The protection layer 72 may be in contact with the sidewall of the contact residue 64a. The protection layer 72 is spaced apart from the ohmic layer 86. A top surface of the protection layer 72 may be higher than a top end of the contact residue 64a. The protection layer 72 may be in contact with the dielectric layer 90.

A sidewall of the lower electrode BE may be in contact with supporting patterns 76a and 80a for preventing the lower electrode BE from leaning. The supporting patterns 76a and 80a may be formed of an insulating layer, e.g., a silicon nitride layer or a silicon oxide layer. The dielectric layer 90 may be in contact with bottom surfaces and top surfaces of the supporting patterns 76a and 80a. The upper electrode TE may fill spaces between the lower electrodes BE and between the supporting patterns 76a and 80a.

FIGS. 4 to 14 illustrate cross-sectional views of stages in a method of fabricating the semiconductor device in FIG. 2.

Figure 4:
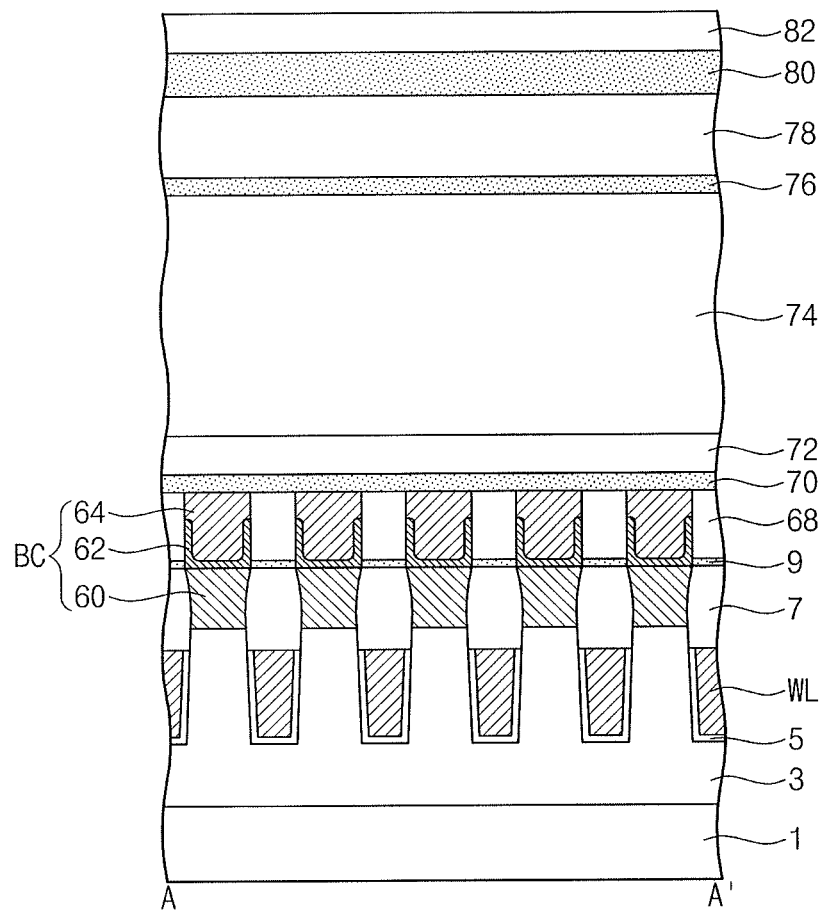
FIGS. 4 to 14 illustrate cross-sectional views of stages in a method of fabricating the semiconductor device in FIG. 2.

Referring to FIGS. 1, 3, and 4, the device isolation layer 3 is formed in or on the substrate 1 to define the active regions AR. For example, the device isolation layer 3 may be formed using a shallow trench isolation (STI) technique. A plurality of trench regions may be formed in the substrate 1 having the device isolation layer 3. The plurality of trench regions may extend in the second direction D2. The gate insulating layer 5, the word line WL, and the first capping pattern 7 are formed in each trench region. The first dopant injection regions 6s and the second dopant injection regions 6d may be formed in the substrate 1 not covered by the first capping patterns 7 in the active regions AR.

The first insulating layer 9 may be formed on an entire surface of the substrate 1. The first insulating layer 9 may be patterned to form openings exposing the second dopant injection regions 6d. The substrate 1, the device isolation layer 3, and the first capping pattern 7 that are exposed by the openings may be etched to form the bit line node contact holes DH. Bottom surfaces of the bit line node contact holes DH are higher than bottom surfaces of the second dopant injection regions 6d and bottom surfaces of the first capping patterns 7. Thereafter, a conductive layer and a second capping layer 13 may be sequentially stacked on the first insulating layer 9 and then may be patterned to form the plurality of second capping patterns 13 having line-shapes, bit lines BL under the second capping patterns 13, and bit line node contacts DC in the bit line node contact holes DH. Next, the spacers 30 are formed on sidewalls of the second capping patterns 13, the bit lines BL, and the bit line node contacts DC.

Subsequently, spaces between the bit lines BL are filled with the second insulating layer 68. The second insulating layer 68 and the first insulating layer 9 may be patterned to form the storage node contact holes BH respectively exposing the first dopant injection regions 6s. For example, a poly-silicon layer may be formed to fill the storage node contact holes BH and then the poly-silicon layer may be recessed to form the first contact patterns 60. Next, a diffusion barrier layer 62 is formed to cover a top surface of each of the first contact patterns 60. The second contact patterns 64 are formed to fill the storage node contact holes BH. The second contact pattern 64 may be formed of a metal layer having an electrical resistance lower than that of the first contact pattern 60, e.g., a tungsten layer. Subsequently, a planarization process may be performed to expose top surfaces of the second contact pattern 64, the second insulating layer 68 and the second capping pattern 13.

The etch stop layer 70, the protection layer 72, a first mold layer 74, a first supporting layer 76, a second mold layer 78, a second supporting layer 80, and a sacrificial layer 82 may be sequentially formed on the top surfaces of the second contact patterns 64, the second insulating layer 68, and the second capping patterns 13. The etch stop layer 70 may be formed of an insulating material having an etch selectivity with respect to the first mold layer 74. For example, the etch stop layer 70 may be formed of a silicon nitride layer. The mold layers 74 and 78 may be formed of, e.g., poly-silicon layers. For example, the protection layer 72 may be formed of at least one of a silicon oxide layer, a silicon nitride layer, a silicon oxynitride layer, a silicon-carbon nitride layer, or a silicon-carbon oxynitride layer. The supporting layers 76 and 80 may be formed of the same insulating material, e.g., silicon nitride layers. The sacrificial layer 82 may be formed of, e.g., a silicon oxide layer.

Figure 5:
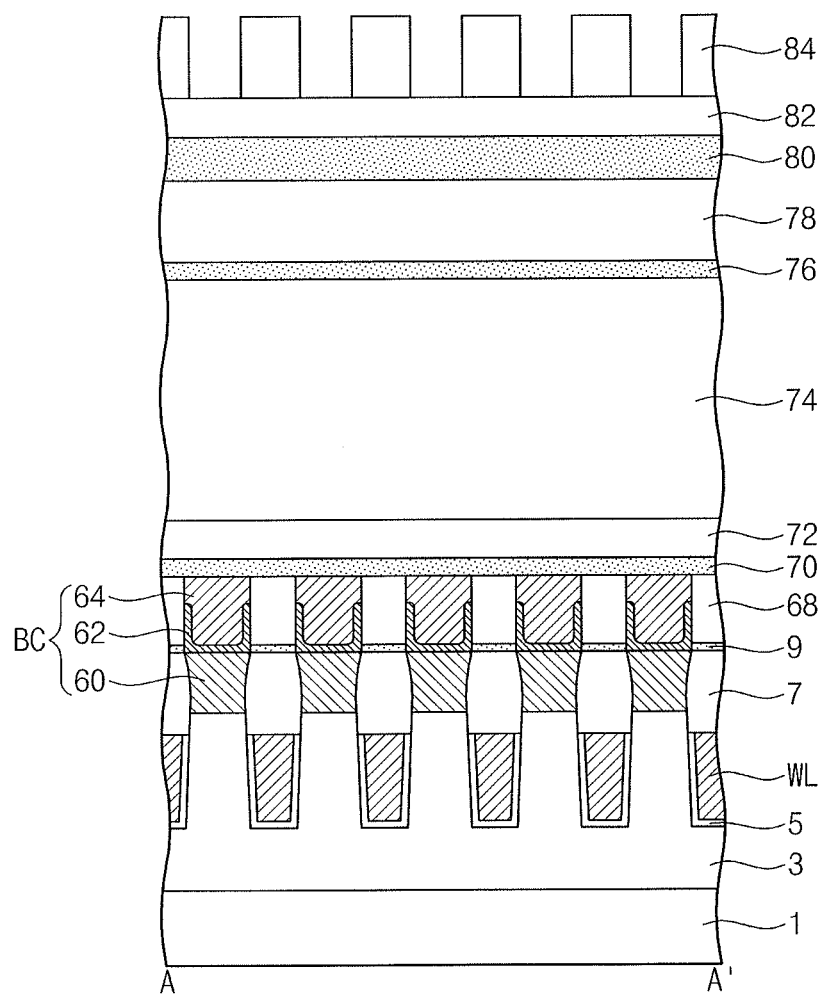

Referring to FIGS. 1, 3, and 5, a first mask pattern 84 is formed on the sacrificial layer 82. The first mask pattern 84 may include openings defining regions where lower electrodes BE are formed. The first mask pattern 84 may be formed of a photoresist pattern, or a multi-layer having an etch selectivity with respect to at least the sacrificial layer 82.

Figure 6:
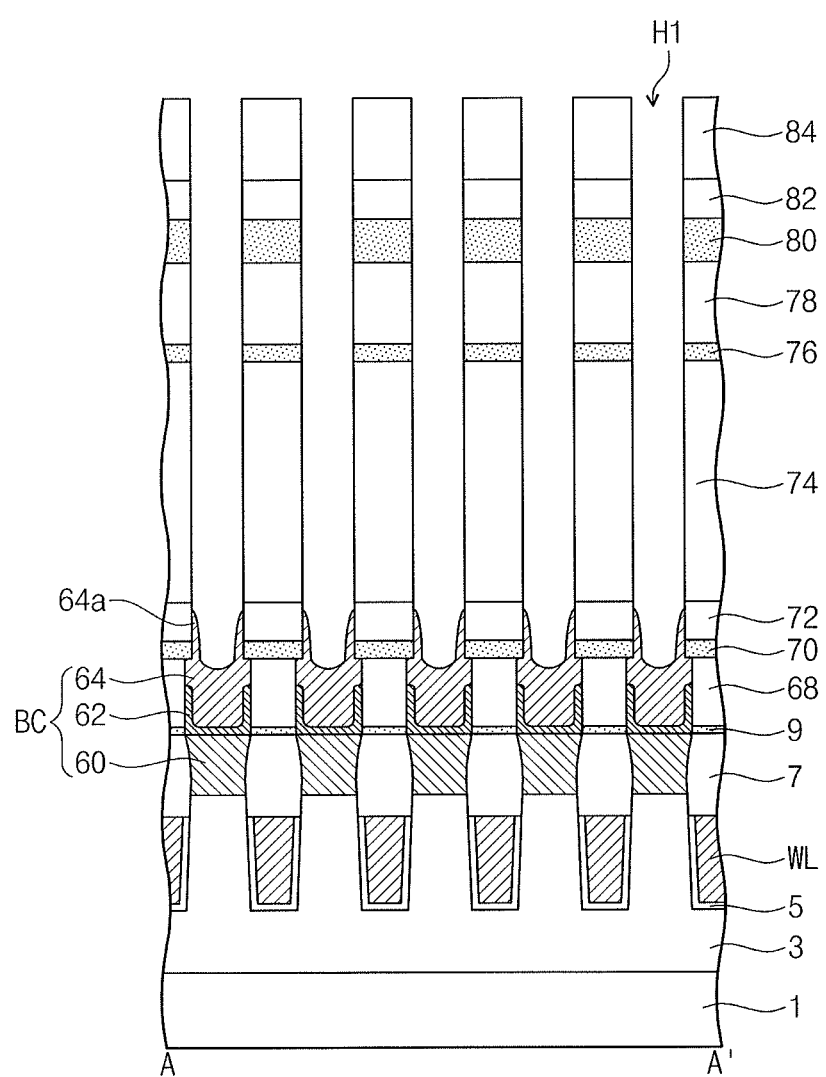

Referring to FIGS. 1, 3, and 6, the sacrificial layer 82, the second supporting layer 80, the second mold layer 78, the first supporting layer 76, the first mold layer 74, the protection layer 72, and the etch stop layer 70 may be successively patterned using the first mask pattern 84 as an etch mask, thereby forming lower electrode holes H1 exposing the top surfaces of the second contact patterns 64, respectively. The second mold layer 78 may be formed to be thinner than the first mold layer 74. Etching characteristics of the mold layers 74 and 78, i.e., of poly-silicon, may be better than etching characteristics of silicon oxide. Thus, bottom/top characteristics of the finally formed lower electrode holes H1 may be excellent.

For example, if the mold layers 74 and 78 are formed of poly-silicon, a bottom width of the lower electrode hole H1 may be substantially equal to a width of the lower electrode hole H1 along a majority of its depth, e.g., the bottom width of the lower electrode hole H1 may be substantially equal to or greater than about 90% of the top width of the lower electrode H1. Thus, when the lower electrode holes H1 are formed, problems, such as a not opening problem, may be prevented.

Additionally, when the lower electrode holes H1 are formed, the top surface of the second contact pattern 64 may be etched to become concave, so residues of the second contact patterns 64 may be sputtered along lower sidewalls of the lower electrode holes H1 by an etching gas having anisotropy to form the contact residue 64a along lower sidewalls of the lower electrode holes H1. At this time, a height of a top end of the contact residue 64a is lower than a height of the top surface of the protection layer 72, so the protection layer 72 separates the contact residue 64a from the first mold layer 74. In other words, a thickness of the protection layer 72 is determined depending on an estimated height of the top end of the contact residue 64a, e.g., the thickness of the protection layer 72 along a direction normal to the substrate 1 may be in a range of about 50 Å to about 2000 Å.

If the semiconductor device is formed without the protection layer 72, the contact residue 64a may be in, e.g., direct, contact with the first mold layer 74. If the second contact pattern 64 is formed of tungsten, the contact residue 64a is also formed of tungsten. Thus, without the protection layer 72, the contact residue 64a of tungsten may be in contact with the first mold layer 74 of poly-silicon, thereby forming tungsten silicide. The tungsten silicide may not be removed, e.g., may remain in a subsequent mold lift off process. Therefore, the tungsten silicide remaining between the lower electrodes BE may cause a leakage current.

Accordingly, as the semiconductor device according to embodiments is formed with the protection layer 72, the contact residue 64a does not contact the first mold layer 74. In other words, as the protection layer 72 separates, e.g., completely separates, between the contact residue 64a and the first mold layer 74, a reaction between the contact residue 64a and the first mold layer 74 may be prevented. As such, leakage current between the lower electrodes BE caused by potential metal silicides in the mold layer 74.

Figure 7:
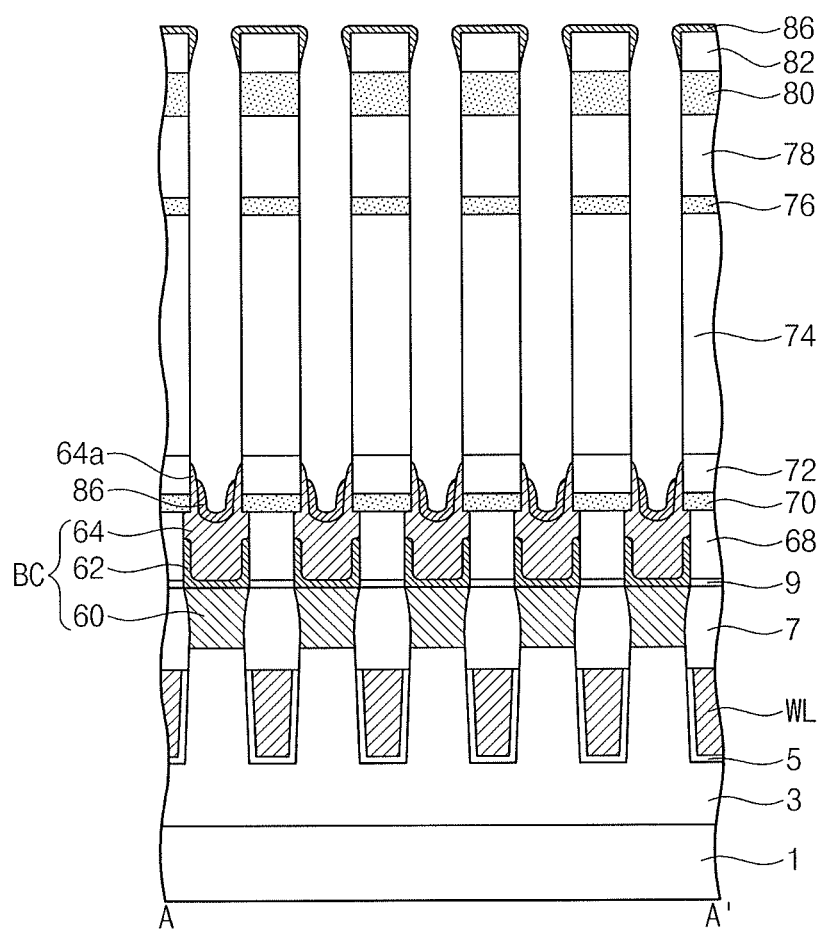

Referring to FIGS. 1, 3 and 7, the first mask pattern 84 is removed. An ohmic layer 86 is formed on the entire surface of the substrate 1. The ohmic layer 86 may be formed of, e.g., titanium. At this time, the ohmic layer 86 may be formed by a method having a poor step coverage property, e.g., a sputtering method. Thus, the ohmic layer 86 may cover the top surfaces of the sacrificial layer 82 and the top surfaces of the second contact patterns 64, i.e., cover bottom surfaces of the lower electrode holes H1 lower sidewalls of the lower electrode holes H1, but may not be formed on inner sidewalls of the lower electrode holes H1. As illustrated in FIG. 7, the ohmic layer 86 covering the second contact patterns 64 may be separated from the first mold layer 74 via the second contact patterns 64 and the protection layer 72.

As described above, if the semiconductor device is formed without the protection layer 72, the ohmic layer 86 may be formed to be in contact with the first mold layer 74, e.g., via the second contact patterns 64. Thus, titanium from the ohmic layer 86 may interact with silicon in the first mold layer 74 to form titanium silicide, thereby causing leakage current in the lower electrodes BE. However, according to embodiments, reaction between the ohmic layer 86 and the first mold layer 74 may be prevented by the protection layer 72.

Figure 8:
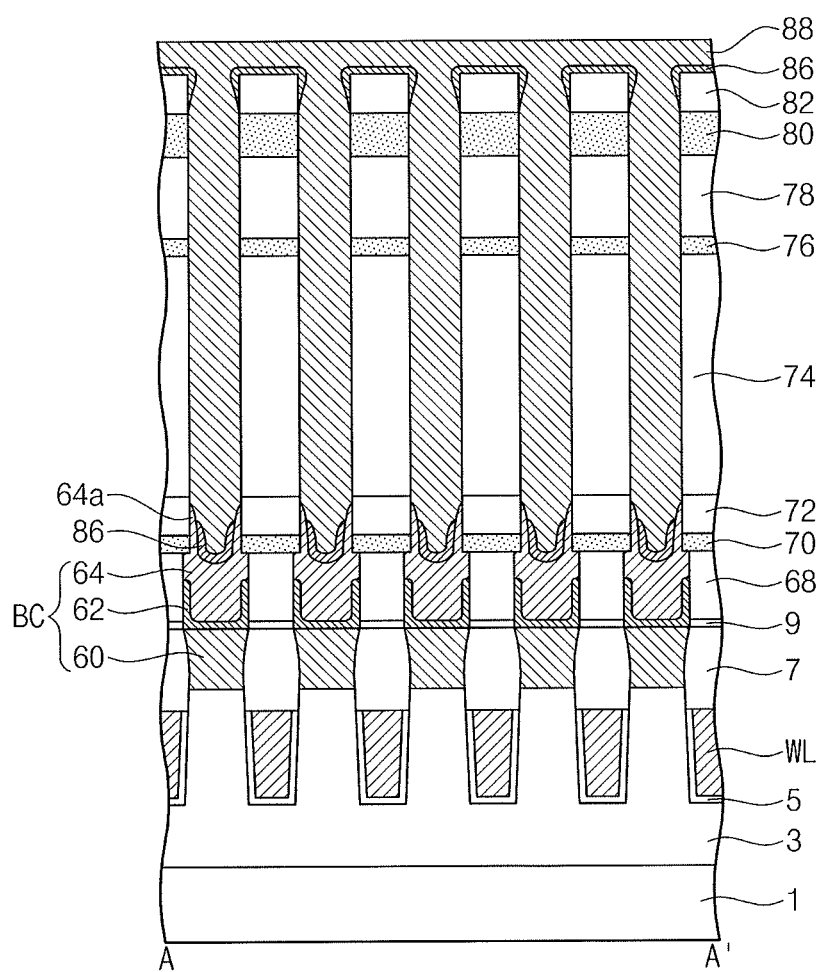

Referring to FIGS. 1, 3 and 8, a lower electrode layer 88 may be formed on the substrate 1. The lower electrode layer 88 may cover at least the ohmic layer 86 and the sidewalls of the lower electrode holes H1. In the present embodiment, the lower electrode layer 88 may fill the lower electrode holes H1.

Figure 9:
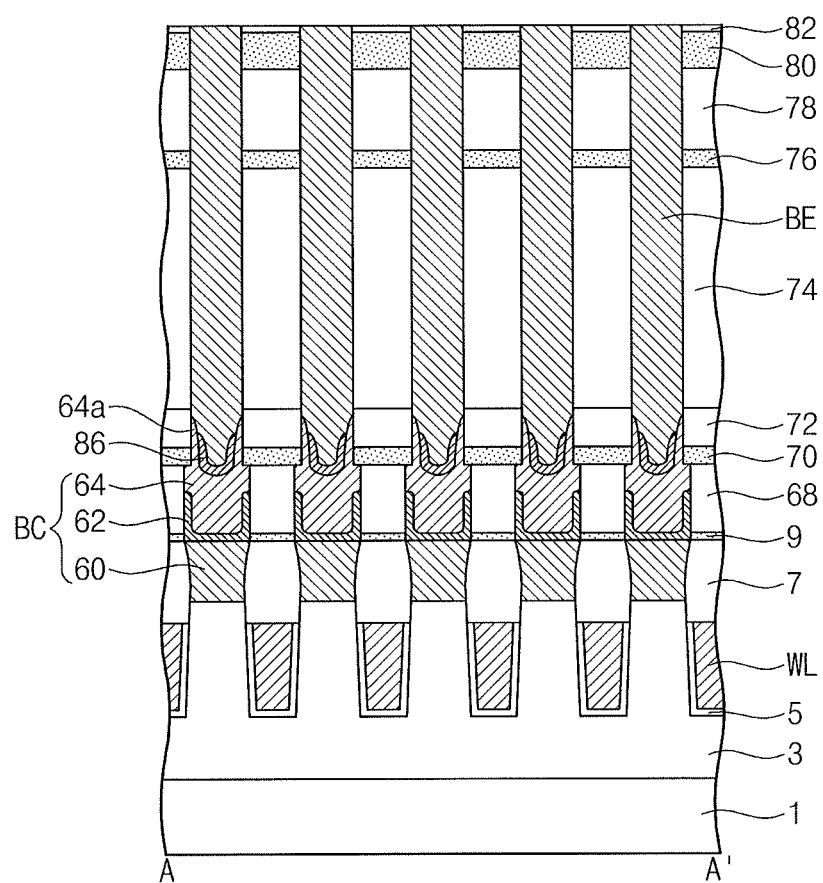

Referring to FIGS. 1, 3, and 9, a blanket etch-back process may be performed on the lower electrode layer 88 to form lower electrodes BE in the lower electrode holes H1, respectively. At this time, the lower electrode layer 88, the ohmic layer 86, and the sacrificial layer 8, 2 which are disposed on the second supporting layer 80, may be removed. In other embodiments, a portion of the sacrificial layer 82 may remain.

Figure 10:
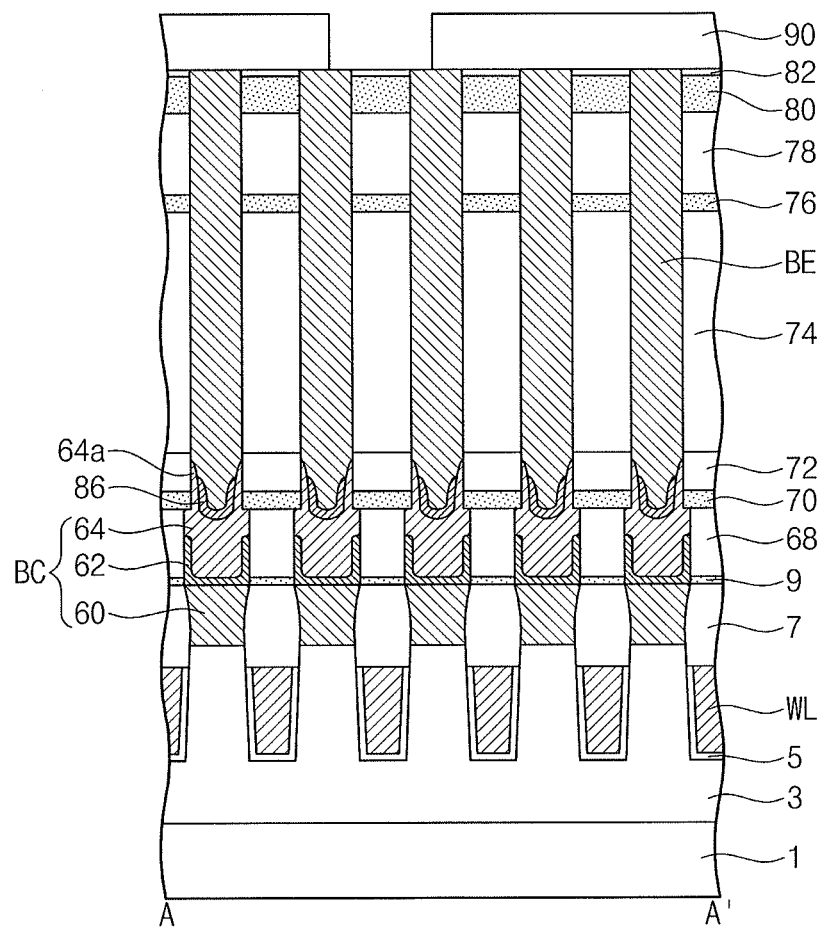

Referring to FIGS. 1, 3, and 10, a second mask pattern 90 is formed on the second supporting layer 80. The second mask pattern 90 may define a planar shape of a supporting pattern formed in a subsequent process. For example, the second mask pattern 90 may be formed to cover at least two lower electrodes BC adjacent to each other.

Figure 11:
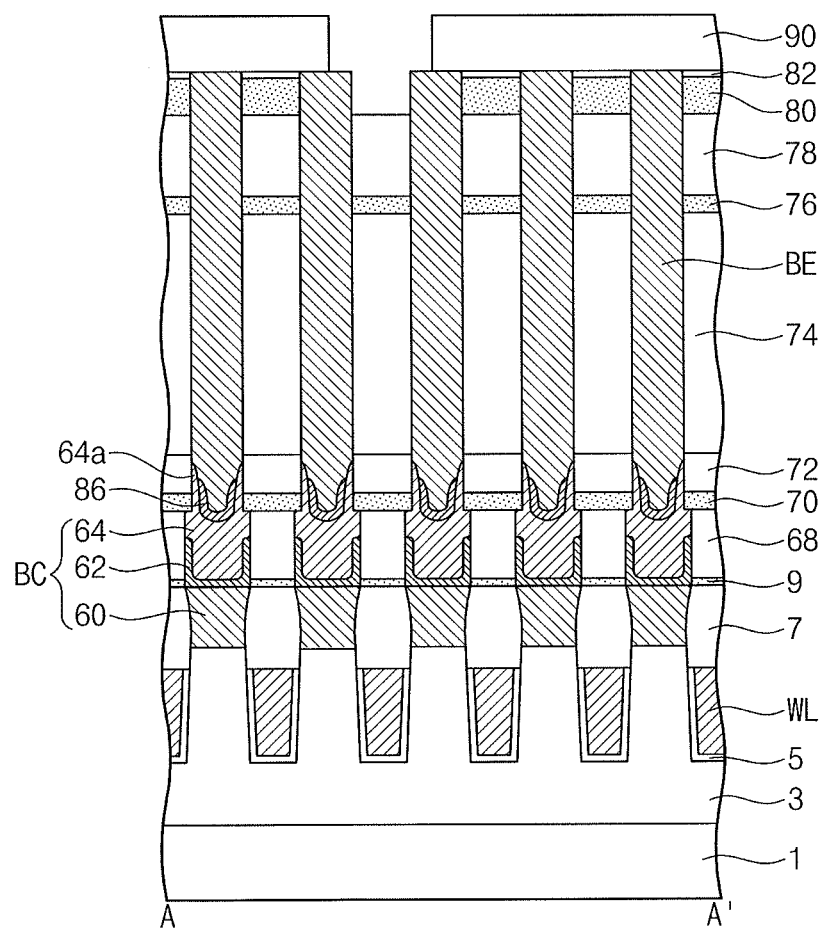
Figure 12:
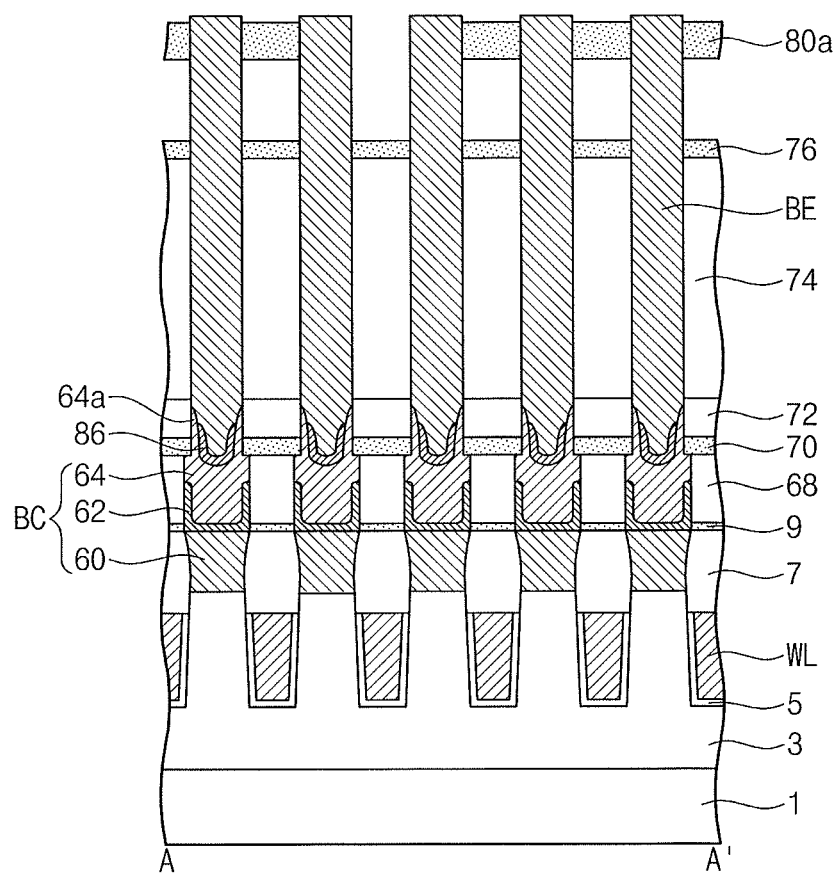

Referring to FIGS. 1, 3, and 11, the second supporting layer 80 is partially removed using the second mask pattern 90 as an etch mask to expose a top surface of the second mold layer 78 and to form a second supporting pattern 80a (FIG. 12).

Referring to FIGS. 1, 3, and 12, an isotropic etching process is performed to completely remove the second mold layer 78. Thus, a top surface of the first supporting layer 76 and upper sidewalls of the lower electrodes BE are exposed.

Figure 13:
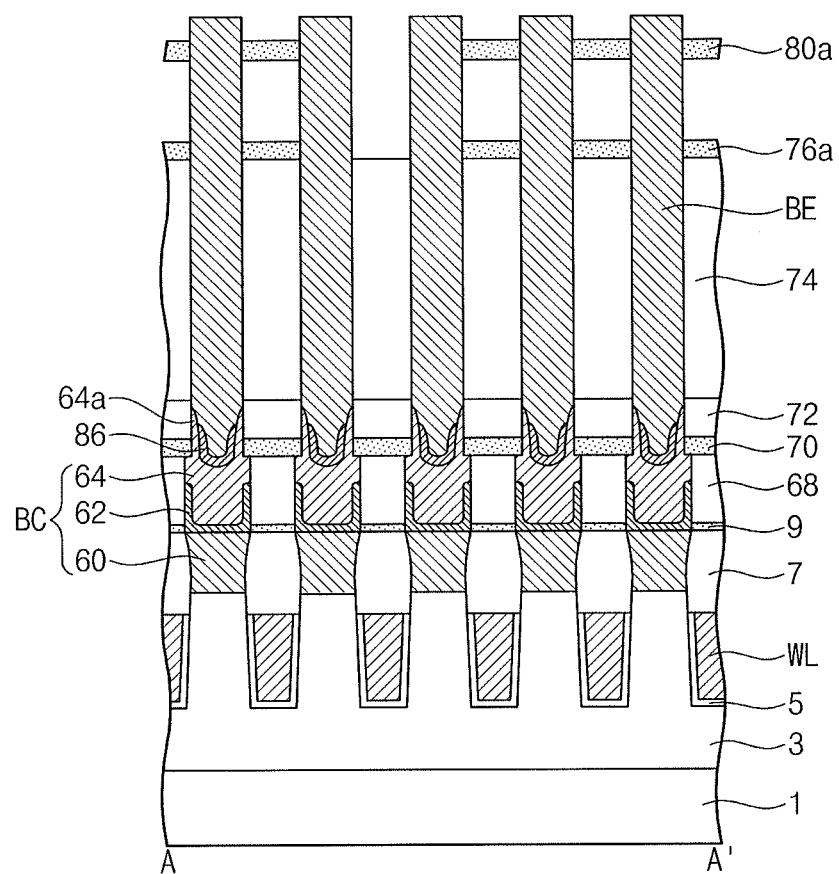

Referring to FIGS. 1, 3, and 13, a blanket etch-back process may be performed on the second supporting pattern 80a. At this time, an upper portion of the second supporting pattern 80a may be etched, and at the same time, the first supporting layer 76 not covered by (or not overlapping with) the second supporting pattern 80a may be etched to form a first supporting pattern 76a. Additionally, a top surface of the first mold layer 74 is partially exposed. Since the second supporting layer 80 is thicker than the first supporting layer 76, the second supporting pattern 80a may not be completely removed when the first supporting layer 76 is etched. Thus, the second supporting pattern 80a having a predetermined thickness may remain after the formation of the first supporting pattern 76a.

Figure 14:
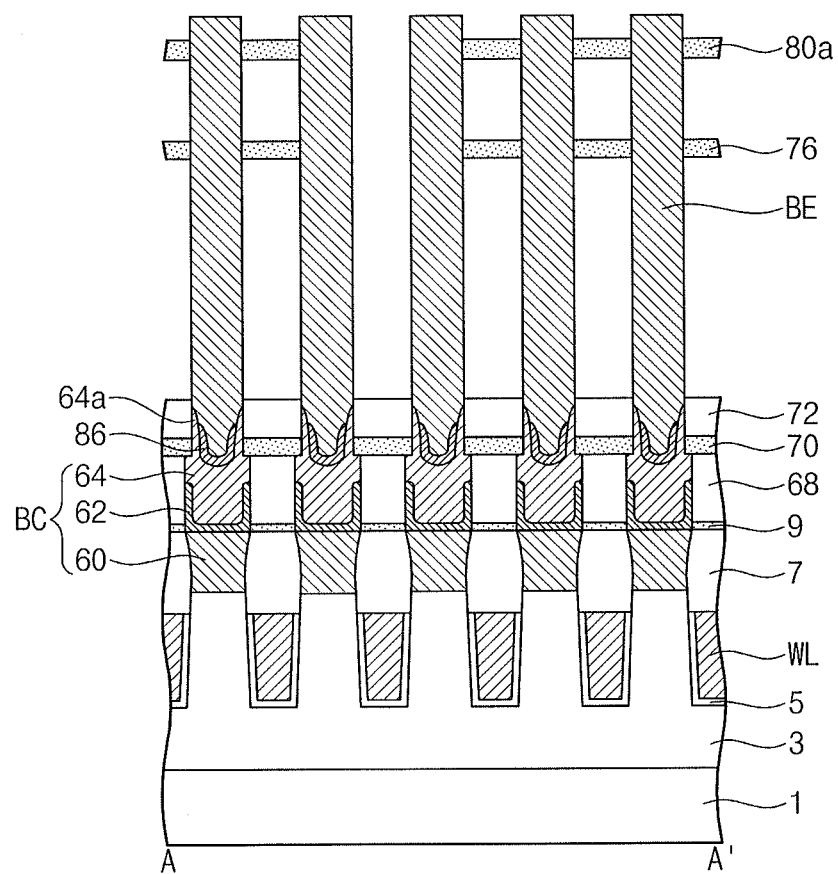

Referring to FIGS. 1, 3, and 14, an isotropic etching process may be performed to completely remove the first mold layer 74. Thus, lower sidewalls of the lower electrodes BE and a top surface of the protection layer 72 are exposed.

Referring again to FIG. 2, the dielectric layer 90 may be conformally formed on the substrate 1 and then the upper electrode TE is formed.

Second Embodiment

Figure 15:
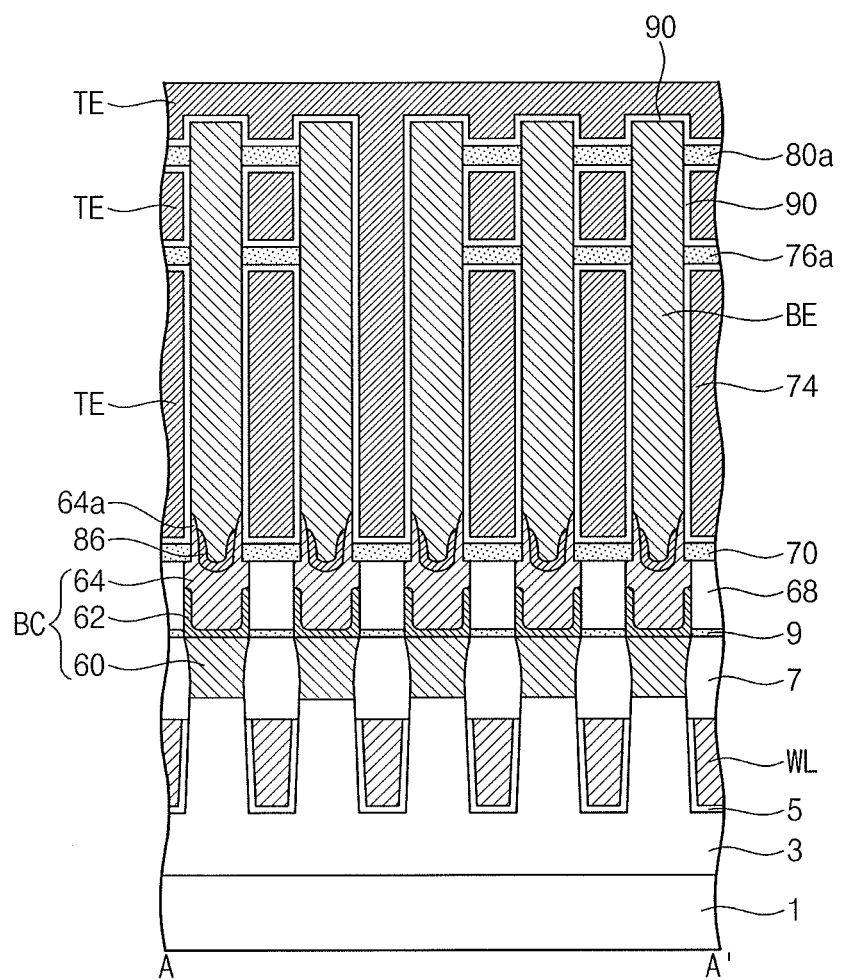
FIG. 15 illustrates a cross-sectional view taken along a line A-A' of FIG. 1 according to a second embodiment.

FIG. 15 illustrates a cross-sectional view taken along a line A-A' of FIG. 1 according to a second embodiment.

Referring to FIG. 15, a semiconductor device according to the present embodiment does not include the protection layer 72. The dielectric layer 90 may be in contact with both the sidewall of the contact residue 64a and the etch stop layer 70. The remaining elements of the semiconductor device according to the present embodiment may be the same as or similar to corresponding elements described with respect to the first embodiment.

Figure 16:
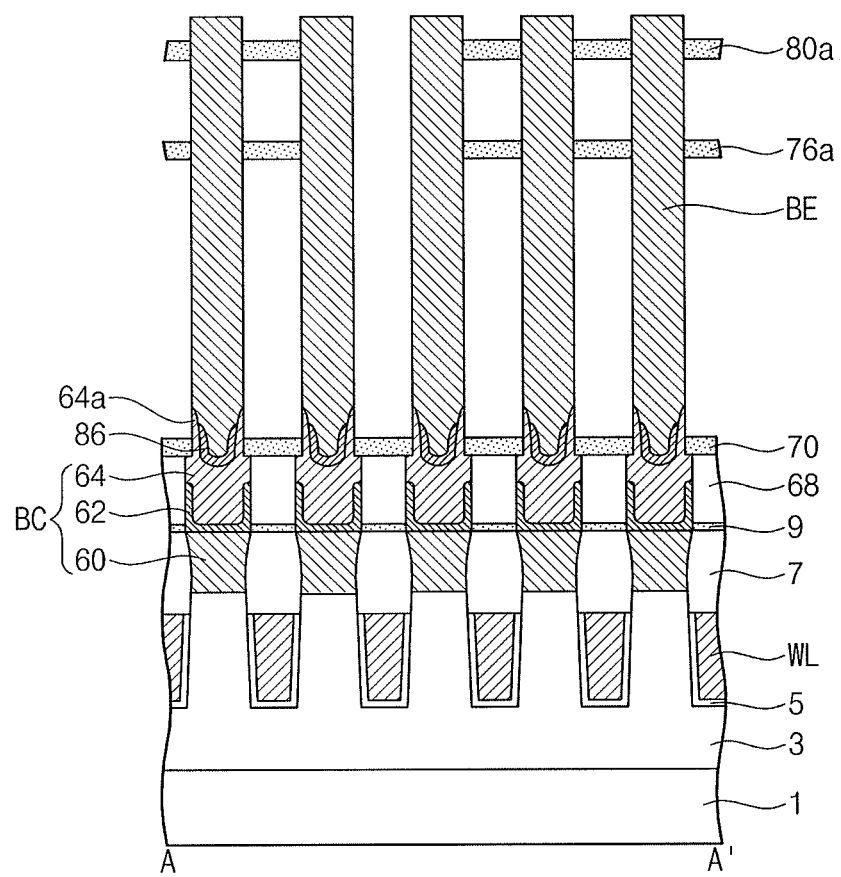
FIG. 16 illustrates a cross-sectional view of a method of fabricating the semiconductor device in FIG. 15.

FIG. 16 illustrates a cross-sectional view of a method of fabricating the semiconductor in FIG. 15.

Referring to FIG. 16, the protection layer 72 may be removed from the structure of FIG. 14 to expose a top surface of the etch stop layer 70. Referring again to FIG. 15, the dielectric layer 90 and the upper electrode TE may be formed. The rest of the fabricating processes of the present embodiment may be the same as or similar to corresponding processes described in the first embodiment, i.e., the protection layer 72 separates the first mold layer 74 from metal containing elements during fabrication as described previously with reference to FIGS. 6-7.

Third Embodiment

Figure 17:
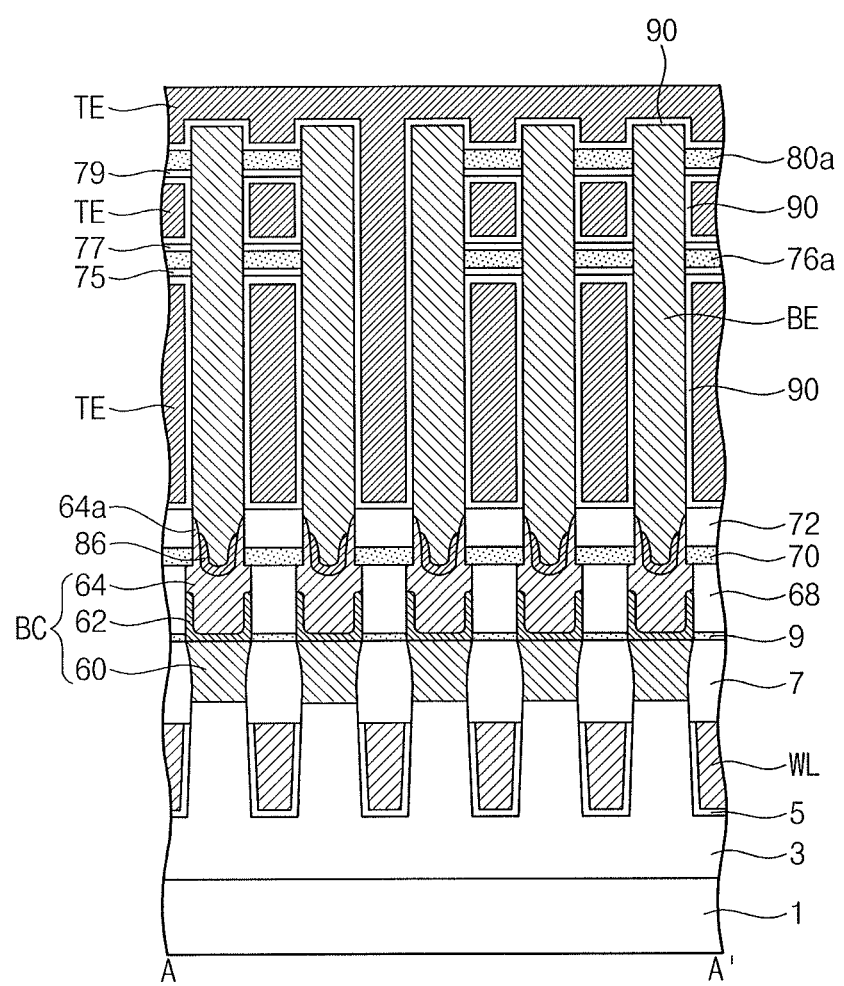
FIG. 17 illustrates a cross-sectional view taken along a line A-A' of FIG. 1 according to a third embodiment.

FIG. 17 illustrates a cross-sectional view taken along a line A-A' of FIG. 1 according to a third embodiment.

Referring to FIG. 17, the lower electrode BE may be formed of ruthenium oxide ($RuO_2$) in a semiconductor device according to a third embodiment. If the lower electrode BE is formed of ruthenium oxide (RuO2), a capacitance of the capacitor may be increased, e.g., as compared with the capacitor including the lower electrode BE formed of titanium nitride by a work function difference. At this time, the supporting patterns 76a and 80a may be formed of metal oxide layers, e.g., as opposed to silicon nitride. This is because an adhesive strength between the ruthenium oxide in the lower electrode BE and the supporting patterns 76a and 80a of silicon nitride layers may be poor.

Therefore, in embodiments, the supporting patterns 76a and 80a may be formed of a tantalum oxide layer or titanium oxide layer doped or undoped with at least one of silicon and aluminum. At this time, the semiconductor device according to the present embodiment may include a first protection layer 72 contacting the contact residue 64a, second and third protection layers 75 and 77 respectively contacting a bottom surface and a top surface of the first supporting pattern 76a, and a fourth protection layer 79 contacting a bottom surface of the second supporting pattern 80a. The protection layers 72, 75, 77, and 79 may be formed of at least one of a silicon oxide layer, a silicon nitride layer, a silicon oxynitride layer, a silicon-carbon nitride layer, or a silicon-carbon oxynitride layer. Meanwhile, the ohmic layer 86 may not be disposed between the second contact pattern 64 and the lower electrode BE in the semiconductor device according to the present embodiment.

The remaining elements of the semiconductor device according to the present embodiment may be the same as or similar to corresponding elements described in the first embodiment.

FIGS. 18 to 21 illustrate cross-sectional views of stages in a method of fabricating the semiconductor device in FIG. 17.

Figure 18:
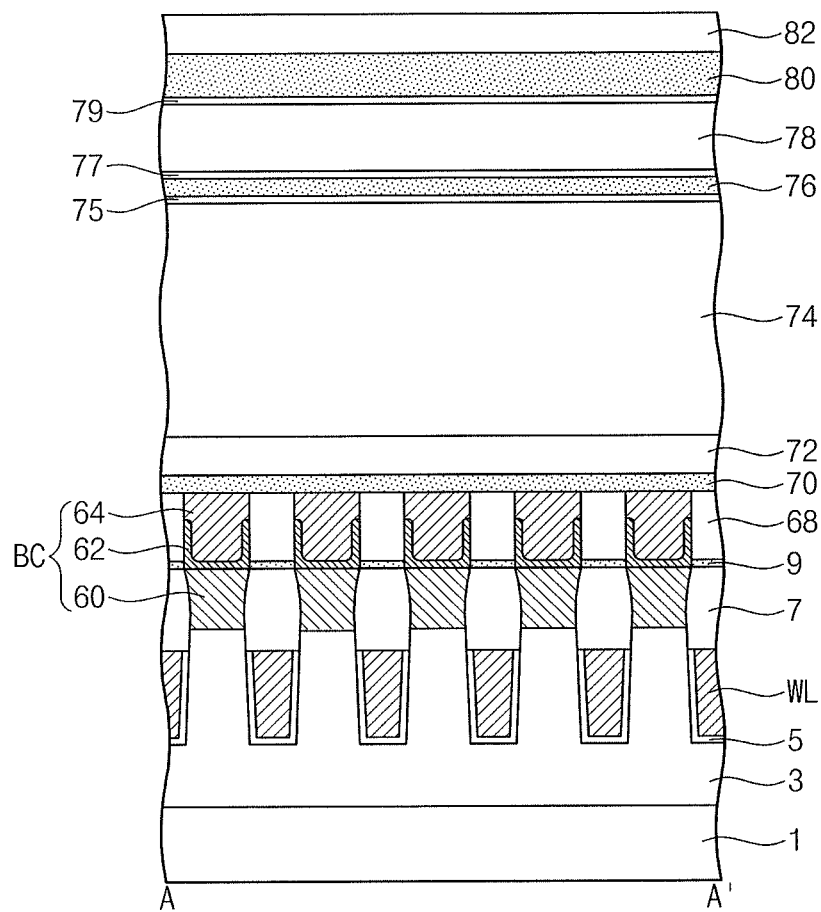
FIGS. 18 to 21 illustrate cross-sectional views of stages in a method of fabricating the semiconductor device in FIG. 17.

Referring to FIG. 18, the word line WL, the bit line BL, the storage node contact BC, and the etch stop layer 70 may be formed as described with reference to FIG. 4. A first protection layer 72, the first mold layer 74, a second protection layer 75, the first supporting layer 76, a third protection layer 77, the second mold layer 78, a fourth protection layer 79, the second supporting layer 80, and the sacrificial layer 82 are sequentially formed on the etch stop layer 70. The protection layers 72, 75, 77, and 79 may be formed of at least one of a silicon oxide layer, a silicon nitride layer, a silicon oxynitride layer, a silicon-carbon nitride layer, or a silicon-carbon oxynitride layer. The supporting layers 76 and 80 may be formed of a tantalum oxide layer or titanium oxide layer doped or undoped with at least one of silicon and aluminum. The sacrificial layer 82 may be formed of, e.g., a silicon oxide layer. The second, third, and fourth protection layers 75, 77, and 79 may prevent the supporting layers 76 and 80 of the metal oxide layers from reacting with the mold layers 74 and 78 formed of poly-silicon. Thus, the mold layers 74 and 78 may be cleanly removed in a subsequent process, thereby removing sources of the leakage current.

Figure 19:
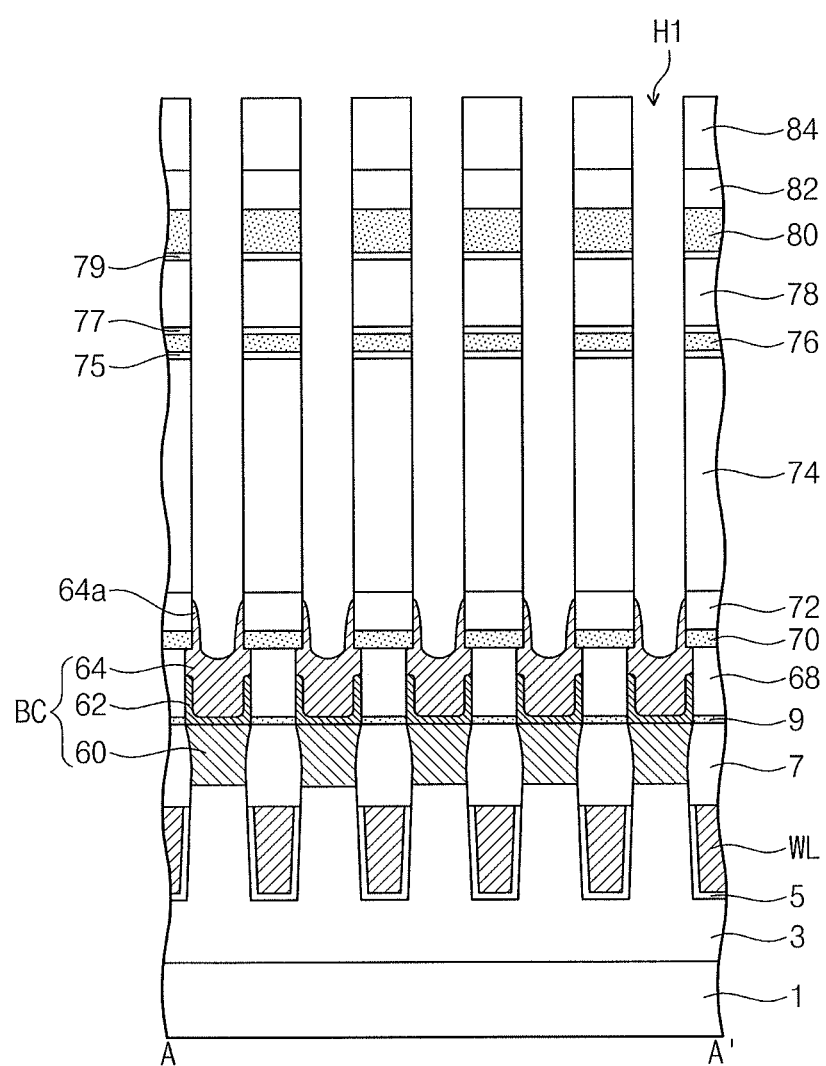

Referring to FIG. 19, the first mask pattern 84 defining regions where lower electrodes BE will be formed may be formed on the sacrificial layer 82. The underlying layers 84, 82, 80, 79, 78, 77, 76, 75, 74, 72, and 70 may be successively patterned using the first mask pattern 84 as an etch mask, thereby forming lower electrode holes H1 exposing top surfaces of the second contact patterns 64. At this time, contact residues 64a may be formed to cover lower sidewalls of the lower electrode holes H1, as described in the first embodiment.

Figure 20:
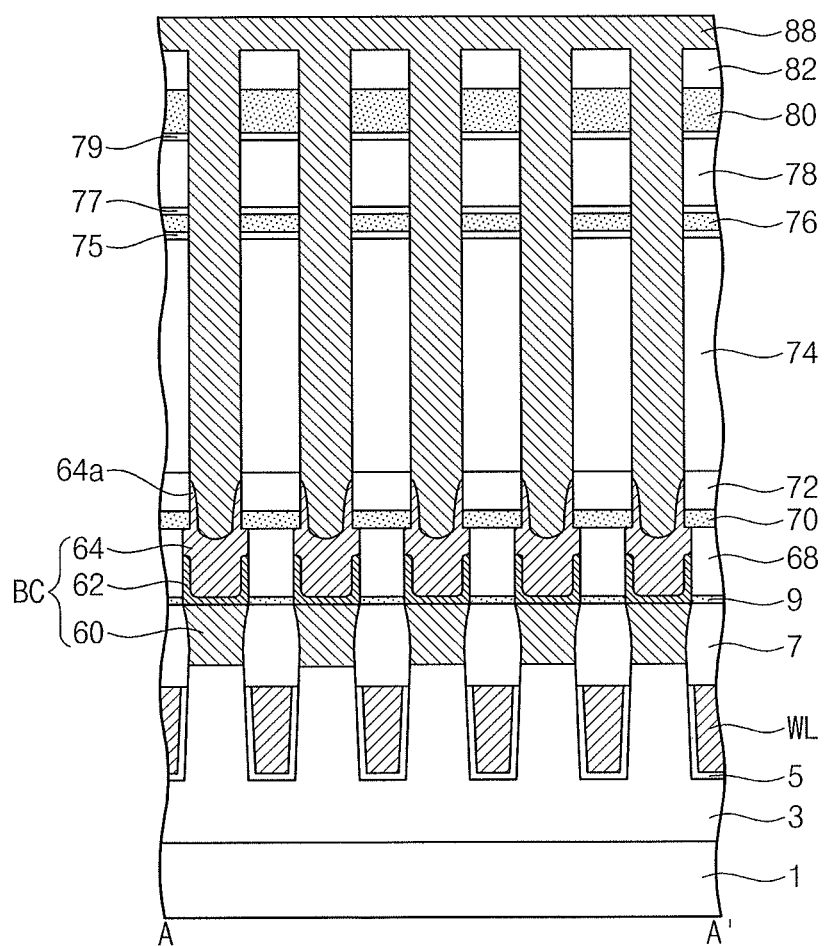

Referring to FIG. 20, the lower electrode 88 may be directly formed to fill the lower electrode holes H1 without the formation of the ohmic layer 86 of the first embodiment.

Figure 21:
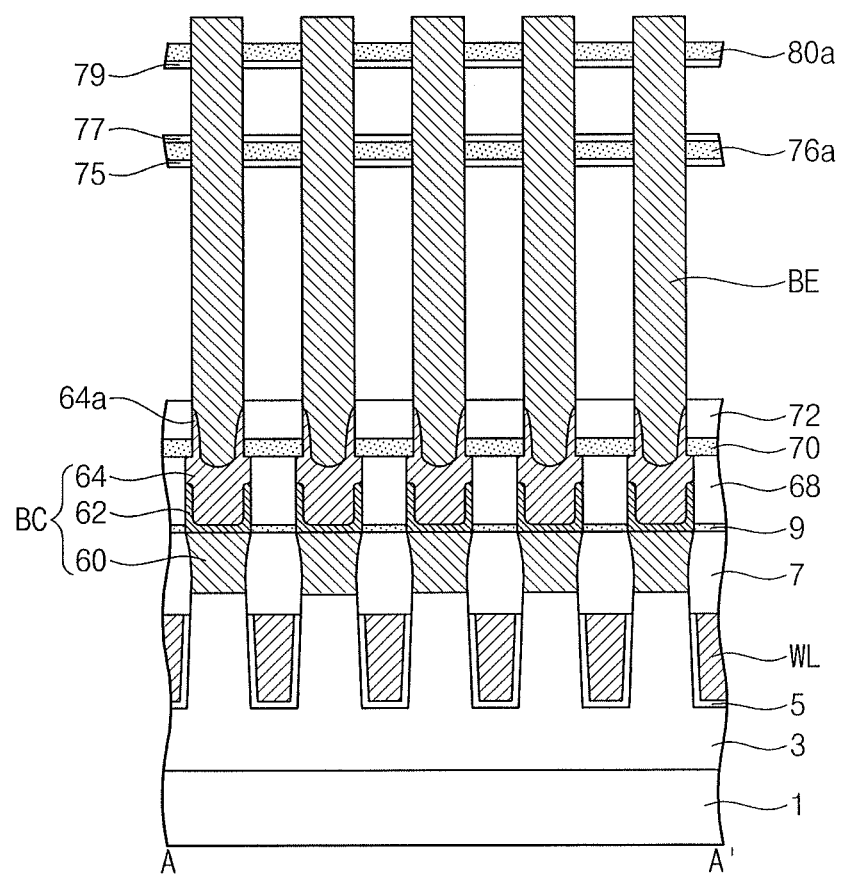

Referring to FIG. 21, a blanket etch-back process may be performed on the lower electrode layer 88 to form lower electrodes BE. Next, subsequent processes that are the same as/similar to corresponding processes described in the first embodiment may be performed to form supporting patterns 76a and 80a and to remove the mold layers 74 and 78. At this time, the protection layers 72, 75, 77, and 79 may not be removed. Since undesired metal oxide layers are not formed between the lower electrodes BE by the protection layers 72, 75, 77, and 79, the mold layers 74 and 78 may be cleanly removed. Subsequently, the dielectric layer 90 and the upper electrode TE are formed.

The remaining fabricating processes of the present embodiment may be the same as/similar to corresponding processes described in the first embodiment.

Fourth Embodiment

Figure 22:
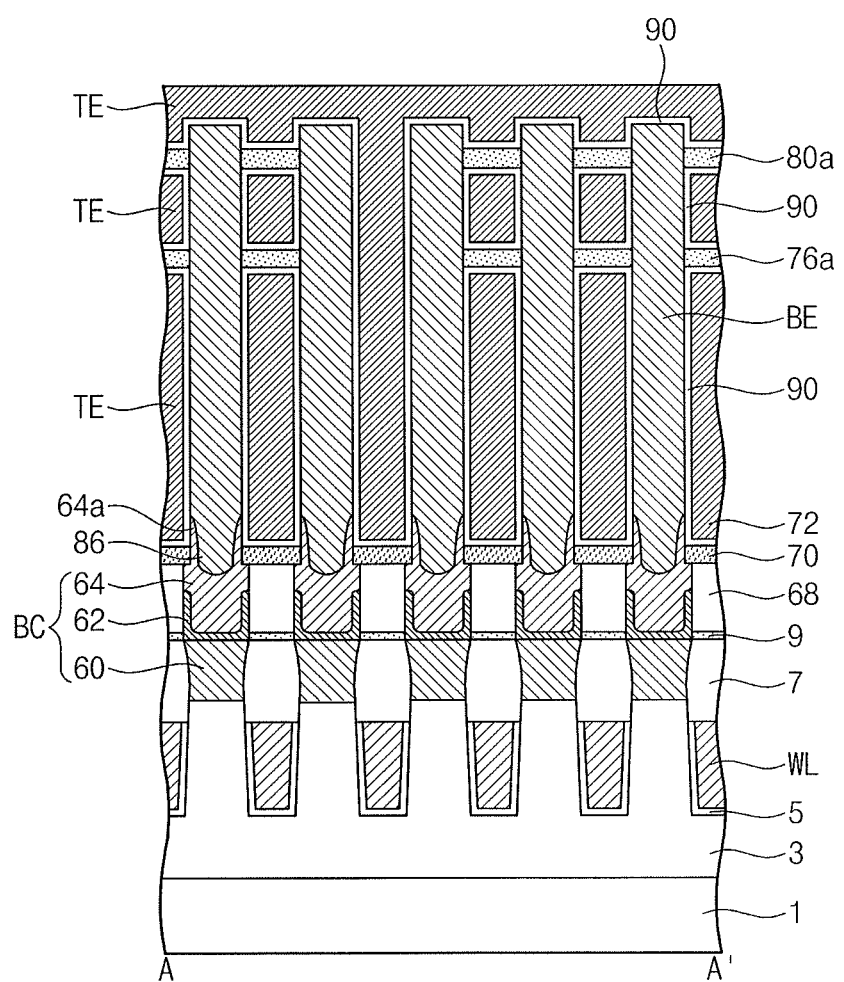
FIG. 22 illustrates a cross-sectional view taken along a line A-A' of FIG. 1 according to a fourth embodiment.

FIG. 22 illustrates a cross-sectional view taken along a line A-A' of FIG. 1 according to a fourth embodiment.

Referring to FIG. 22, in a semiconductor device according to the present embodiment, the dielectric layer 90 may be in direct contact with the supporting patterns 76a and 80a, the contact residue 64a, and the etch stop layer 70 without the protection layers 72, 75, 77, and 79 of the third embodiment. The remaining elements of the semiconductor device according to the present embodiment may be the same as/similar to corresponding elements described in the third embodiment.

In a method of fabricating the semiconductor device of FIG. 22, the protection layers 72, 75, 77, and 79 may be removed from the structure of FIG. 21, thereby exposing top surfaces of the supporting patterns 76a and 80a, sidewalls of the contact residue 64a, and the top surface of the etch stop layer 70. Subsequently, the dielectric layer 90 and the upper electrode TE may be formed. The remaining fabricating processes of the present embodiment may be the same as/similar to corresponding processes described in the third embodiment.

The semiconductor devices in the aforementioned embodiments may be encapsulated using various packaging techniques. For example, the semiconductor devices according to embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

The package in which the semiconductor device according to one of the above embodiments is mounted may further include a controller and/or a logic device controlling the semiconductor device.

Figure 23:
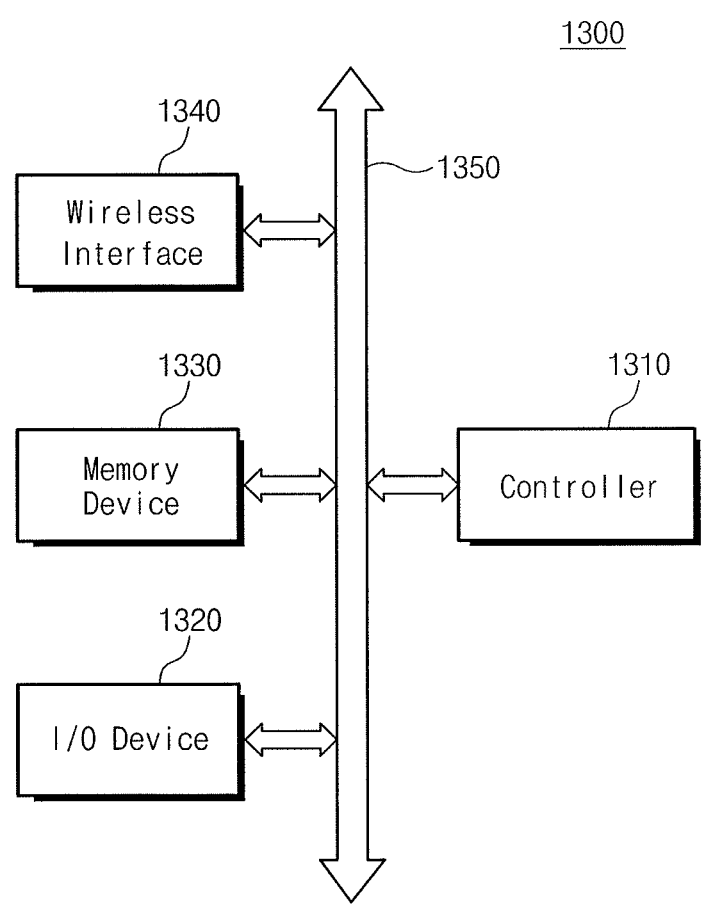
FIG. 23 illustrates a schematic block diagram of an electronic device including a semiconductor device according to embodiments.

FIG. 23 illustrates a schematic block diagram of an electronic device including a semiconductor device according to embodiments.

Referring to FIG. 23, an electronic device 1300 according to embodiments may be one of a personal digital assistant (PDA), a laptop computer, a portable computer, a web tablet, a wireless phone, a mobile phone, a digital music player, a cable/wireless electronic device, and any complex electronic device including at least two thereof. The electronic device 1300 may include a controller 1310, an input/output (I/O) device 1320 (e.g., a keypad, a keyboard and/or a display), a memory device 1330, and a wireless interface unit 1340 which are combined with each other through a data bus 1350. For example, the controller 1310 may include at least one of a microprocessor, a digital signal processor, a microcontroller or other logic devices. The other logic devices may have a similar function to any one of the microprocessor, the digital signal processor and the microcontroller. The memory device 1330 may store, for example, commands performed by the controller 1310. Additionally, the memory device 1330 may also be used for storing a user data. The memory device 1330 may include at least one of the semiconductor devices according to the aforementioned embodiments. The electronic device 1300 may use the wireless interface unit 1340 in order to transmit data to a wireless communication network communicating with a radio frequency (RF) signal or in order to receive data from the network. For example, the wireless interface unit 1340 may include an antenna or a wireless transceiver. The electronic device 1300 may be used in a communication interface protocol such as a third generation communication system (e.g., CDMA, GSM, NADC, E-TDMA, WCDAM, and/or CDMA2000).

Figure 24:
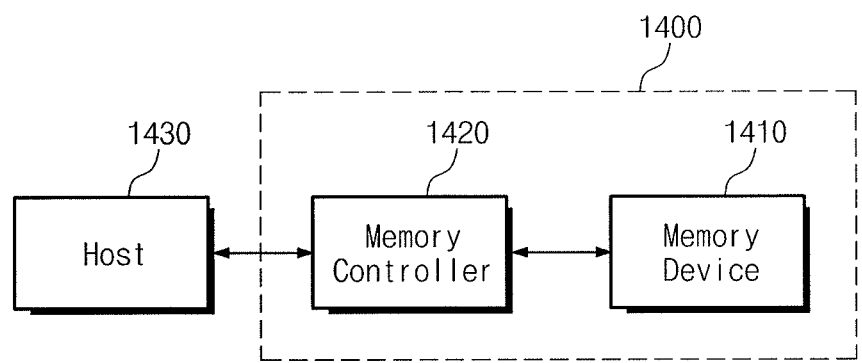
FIG. 24 illustrates a schematic block diagram of a memory system including a semiconductor device according to embodiments.

FIG. 24 illustrates a schematic block diagram of a memory system including a semiconductor device according to embodiments.

Referring to FIG. 24, the semiconductor devices according to embodiments may be used in order to realize a memory system. A memory system 1400 may include a memory device 1410 for storing massive data and a memory controller 1420. The memory controller 1420 may read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to the above embodiments.

According to embodiments, contact residue generated during formation of the contact hole may contact a protection layer, rather than a mold layer, so the protection layer prevents the contact residue from reacting with the mold layer. Thus, the mold layer may be cleanly removed in a subsequent process, thereby reducing an error occurrence rate. As a result, the yield of the semiconductor device may be increased. Additionally, metal silicide is not generated between the lower electrodes, thereby preventing leakage current between the lower electrodes.

Therefore, embodiments may provide highly integrated semiconductor devices capable of preventing a leakage current. Embodiments may also provide methods of fabricating a highly integrated semiconductor device capable of increasing a yield.

While embodiments have been described with reference to example embodiments, it will be apparent to those skilled in the art that various changes and modifications may be made without departing from the described embodiments. Therefore, it should be understood that the above embodiments are not limiting, but illustrative. Thus, embodiments are to be determined by the broadest permissible interpretation of the following claims and their equivalents, and shall not be restricted or limited by the foregoing description.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a storage node contact on a substrate;
   a lower electrode on the storage node contact, a lower sidewall of the lower electrode being covered by a contact residue of a same material as the storage node contact, and an outermost surface of the contact residue being horizontally spaced apart from a corresponding outermost surface of the storage node contact; and
   a first protection layer surrounding the lower sidewall of the lower electrode and the contact residue, a lateral surface of the first protection layer contacting lateral surfaces of the lower sidewall of the lower electrode and of the contact residue, a top surface of the first protection layer being higher than a top end of the contact residue.

2. The semiconductor device as claimed in claim 1, further comprising an ohmic layer between the lower electrode and the storage node contact, the top surface of the first protection layer being higher than a top end of the ohmic layer.

3. The semiconductor device as claimed in claim 1, wherein:
the storage node contact includes a plurality of storage node contacts; and
the semiconductor device further comprises:
a filling insulating layer between storage node contacts adjacent to each other and covered by the first protection layer, and
an etch stop layer between the first protection layer and the filling insulating layer.

4. The semiconductor device as claimed in claim 1, further comprising at least one supporting layer contacting an upper sidewall of the lower electrode.

5. The semiconductor device as claimed in claim 4, wherein:
the supporting layer includes a metal oxide layer; and
the semiconductor device further comprises a second protection layer contacting at least one of a top surface and a bottom surface of the supporting layer.

6. The semiconductor device as claimed in claim 4, wherein the supporting layer and the first protection layer include insulating layers.

7. The semiconductor device as claimed in claim 1, wherein a top surface of the storage node contact is concave.

8. The semiconductor device as claimed in claim 1, further comprising:
a dielectric layer covering a sidewall and a top surface of the lower electrode; and
an upper electrode covering the dielectric layer, the dielectric layer extending to cover a sidewall of the contact residue.

9. A semiconductor device, comprising:
a storage node contact on a substrate;
a lower electrode on the storage node contact;
a contact residue of a same material as the storage node contact and extending from the storage node contact along a lower sidewall of the lower electrode, an outermost surface of the contact residue and an outermost surface of an upper sidewall of the lower electrode being level with each other; and
a first protection layer surrounding an upper portion of the contact residue,
wherein the first protection layer is in direct contact with a lateral surface of the contact residue and in direct contact with a lateral surface of a portion of the lower electrode, the lateral surfaces of the contact residue and the lower electrode being the level outermost surfaces of the contact residue and the lower electrode.

10. The semiconductor device as claimed in claim 9, further comprising:
a dielectric layer on a sidewall of the lower electrode, the first protection layer separating the dielectric layer from the contact residue; and
an upper electrode on the dielectric layer, the dielectric layer separating the first protection layer from the upper electrode and from the lower electrode.

11. The semiconductor device as claimed in claim 9, wherein the contact residue is integral with the storage node contact and defines an empty, volumetric space above the storage node contact, a lower end of the lower electrode being insertable into the volumetric space, and a width between opposite outermost surfaces of the contact residue being smaller than a width between opposite outermost surfaces of the storage node contact.

12. The semiconductor device as claimed in claim 9, wherein the level outermost surfaces of the contact residue and lower electrode define openings between adjacent lower electrodes, respective dielectric layers and upper electrodes being positioned in the defined openings.

13. The semiconductor device as claimed in claim 9, further comprising:
a dielectric layer on a sidewall of the lower electrode, the dielectric layer being in direct contact with the contact residue and in direct contact with a portion of the lower electrode; and
an upper electrode on the dielectric layer.

14. A method of fabricating a semiconductor device, the method comprising:
forming a storage node contact on a substrate;
sequentially forming a first protection layer and a mold layer that cover the storage node contact;
successively patterning the mold layer and the first protection layer to form a contact hole exposing the storage node contact; and
forming a lower electrode on the storage node contact filling the contact hole,
wherein, when the contact hole is formed, an upper portion of the storage node contact is dug, such that a contact residue of a same material as the storage node contact is formed on a lower sidewall of the contact hole, and an outermost surface of the contact residue being horizontally spaced apart from a corresponding outermost surface of the storage node contact,
wherein the first protection layer surrounds a lower sidewall of the lower electrode and the contact residue, a lateral surface of the first protection layer contacting lateral surfaces of the lower sidewall of the lower electrode and of the contact residue; and
wherein the contact residue covers a lower sidewall of the lower electrode, such that a height of a top surface of the first protection layer is higher than a top end of the contact residue.

15. The method as claimed in claim 14, wherein the mold layer is formed of poly-silicon or single-crystalline silicon, and the storage node contact is formed of metal.

16. The method as claimed in claim 14, wherein the first protection layer is formed of at least one of a silicon oxide layer, a silicon nitride layer, a silicon oxynitride layer, a silicon-carbon nitride layer, or a silicon-carbon oxynitride layer.

17. The method as claimed in claim 14, further comprising forming a supporting layer on the mold layer, the contact hole being formed by successively patterning the supporting layer, the mold layer, and the first protection layer.

18. The method as claimed in claim 17, wherein:
the supporting layer is formed of a metal oxide layer, and
the method further comprises forming a second protection layer between the supporting layer and the mold layer.

* * * * *